United States Patent [19]

Dew-Hughes

[11] 4,215,465
[45] Aug. 5, 1980

[54] METHOD OF MAKING $V_3Ga$ SUPERCONDUCTORS

[75] Inventor: David Dew-Hughes, Bellport, N.Y.

[73] Assignee: The United States of America as represented by the United States Department of Energy, Washington, D.C.

[21] Appl. No.: 967,178

[22] Filed: Dec. 6, 1978

[51] Int. Cl.² ........................................... H01L 39/24
[52] U.S. Cl. .................. 29/599; 174/126 S; 148/11.5 F; 148/11.5 Q; 148/133; 428/662; 428/674
[58] Field of Search ............ 148/11.5 R, 133, 11.5 P, 148/11.5 Q, 11.5 F; 428/660, 662; 29/599; 174/126 S, 128 S

[56] References Cited
U.S. PATENT DOCUMENTS

| | | | |
|---|---|---|---|
| 3,759,750 | 9/1973 | Müller et al. | 29/599 |
| 3,815,224 | 6/1974 | Pickus et al. | 174/126 S |
| 3,868,768 | 3/1975 | Meyer | 174/126 S |
| 3,874,074 | 4/1975 | Meyer | 174/126 S |
| 4,153,986 | 5/1979 | Tachirawa et al. | 29/599 |

*Primary Examiner*—Francis S. Husar
*Assistant Examiner*—V. K. Rising
*Attorney, Agent, or Firm*—R. V. Lupo; Leonard Belkin

[57] ABSTRACT

An improved method for producing a vanadium-gallium superconductor wire having aluminum as a component thereof is disclosed, said wire being encased in a gallium bearing copper sheath. The superconductors disclosed herein may be fabricated under normal atmospheres and room temperatures by forming a tubular shaped billet having a core composed of an alloy of vanadium and aluminum and an outer sheath composed of an alloy of copper, gallium and aluminum. Thereafter the entire billet is swage reduced to form a wire therefrom and heat treated to form a layer of $V_3$ Ga in the interior of the wire.

6 Claims, 3 Drawing Figures

METHOD OF MAKING V$_3$Ga SUPERCONDUCTORS

BACKGROUND OF THE INVENTION

1. Field of the Invention

This invention was made under, or during the course of, a contract with the United States Department of Energy.

The present invention related to a superconductor and a method of producing the superconductor, and more particularly, to a superconductor including V$_3$Ga and a method of production thereof.

2. Description of the Prior Art

At the present time, superconductors are mostly used as magnet wires capable of generating a strong DC magnetic field without consuming any electrical power. There are two generally types of superconductors shown in the prior art. A first of such types is commonly referred to as an alloy wire, such as an alloy of niobium and zirconium, or niobium and titanium and these have been used after drawing down to wires of about 0.25 millimeters in diameter. Such wires can be easily deformed. However, the alloy wires disclosed in the prior art do not have sufficient superconductivity for many uses.

A second type of superconductor shown in the prior art is classed as a compound wire type such as Nb$_3$Sn and V$_3$Ga which have the A 15 crystal structure. Unfortunately the prior art compound wire type superconductors are brittle and their production requires special contrivances and use thereof is limited. However, compound wire types of superconductors have been found to have superior superconducting properties as compared with the alloy wire type superconductors.

In respect of V$_3$Ga, there is known a production technique wherein a vanadium core in a wire or tape form is continuously dipped in molten gallium and after making gallium-diffused layer on the surface of the vanadium core, the resulting wire or tape is heat-treated at appropriate temperatures to produce a continuous V$_3$Ga layer. Further, it is known that before the aforementioned heat-treatment a copper coating on the material facilitates production of V$_3$Ga (U.S. Pat. No. 3,674,553).

Furthermore, a superconductor comprising V$_3$Ga is produced by making a composite comprising a member selected from the group consisting of copper, silver and a copper-silver alloy, each of them containing 0.1 to 30 atomic percent gallium and a core metal selected from the group consisting of pure vanadium and vanadium alloy containing 0.1 to 10 atomic percent titanium, zirconium or hafnium, fabricating the resulting composite to a desirable shape, and heat-treating the thus fabricated composite (U.S. Pat. No. 3,857,173).

Also it is known that when superconducting wires materials are put in practical applications, the surface thereof has to be covered with normal metals having low electrical resistance such as copper and silver so as to stabilize the superconductivity.

For that purpose, according to the conventional method in a compound superconductor it was required to provide specially a stabilizing metallic layer by copper or silver plating after the heat treatment.

SUMMARY OF THE INVENTION

A method of making a composite superconductor having a core consisting substantially of an alloy of vanadium containing from about 0.1 to about 25.0 atomic percent aluminum based on the weight of the core, said core having an external matrix superimposed on the outer surface of said core, said matrix consisting substantially of an alloy of copper containing from about 0.1 to about 30 atomic percent gallium and from about 0.0 to about 10 atomic percent aluminum, fabricating the resultant ccomposite to a desirable shape, combining where necessary with aluminum stabilization and heat-treating the thus fabricated composite.

According to another aspect of the present invention, there is provided a superconductor comprising a vanadium-aluminum alloy core containing from 0.1 to 25.0 atomic percent aluminum, an intermediate layer between said core and the matrix of V$_3$Ga containing 0-10 atomic percent aluminum overlaying the vanadium core and a copper alloy layer containing from 0.1 to 30 atomic percent gallium and from 0.1 to 10 atomic percent aluminum overlaying the V$_3$Ga layer. The desired vanadium-aluminum alloy core may be omitted and the V$_3$Ga become the core, and if desired a pure aluminum layer may overlay the copper alloy, or it may be inserted in the copper alloy as a separate core, or combined with the superconductor in some other way.

Conventional methods can be suitably employed to fabricate the superconductors of this invention. Exemplary of one such method is the following procedure. A core billet in the shape of a solid cylinder containing the desired vanadium-aluminum core is prepared; the core thus formed is then placed into intimate contact with the interior wall of a tubular shaped matrix of copper-gallium or copper-gallium-aluminum alloy, shaping the composite formed by the core and the matrix into the desired shape by conventional shaping techniques, e.g. swaging, rolling, wire drawing and thereafter heating the thus formed composite to a temperature ranging from about 500° C. to about 750° C. to form an intermediate layer composed of V$_3$Ga between the core and the matrix.

DETAILED DESCRIPTION OF THE INVENTION

Figure 1:
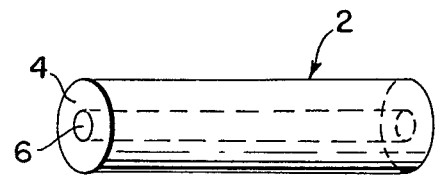
FIG. 1 is an isometric view of a linear portion of a billet having two dissimilar components.

In the drawing, FIG. 1 shows a composite which is shown in this instance as a billet 2 having a sheath 4 surrounding a core 6. The sheath 4 is composed of a copper alloy containing from 0.1 to 30 atomic percent gallium with the balance of the alloy being made up of copper. In a preferred embodiment of our invention we additionally incorporate up to 10 atomic percent aluminum into the copper alloy forming sheath 4 shown in FIG. 1. The core 6 in FIG. 1 is composed of a vanadium alloy containing from 0.1 to 25.0 atomic percent aluminum.

Figure 2:
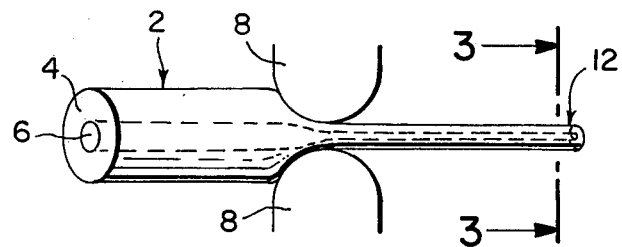
FIG. 2 is an isometric view of a swaging operation being performed on the wire of figure.

The billet 2 shown in FIG. 1 can be prepared by conventional methods such as taking a solid rod made of a copper alloy suitable for use in our invention, as a sheath 4 boring a hole lengthwise in the center of the rod and thereafter inserting a solid rod and inserting it into the hole bored in the sheath 4 to form the core 6 of the billet 2. Thereafter, the billet 2 can be passed through a swaging die 8 as shown in FIG. 2 with the swaged portion 12 of the billet 2 being greatly reduced in diameter to form a wire of the billet 2. Any conventional billet forming, swaging, and wire reducing processes can be used in carrying out our invention.

Figure 3:
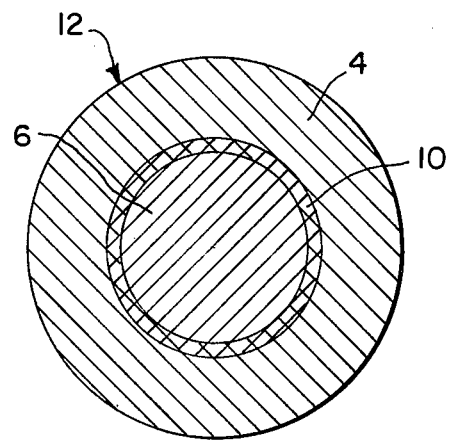
FIG. 3 is a cross sectional view of the wire after swaging along plane 3 of FIG. 2.

Thereafter the swaged portion 12 obtained from the billet 2 as shown in FIG. 3 is heat-treated to make gallium diffuse selectively from sheath 4 shown in FIGS. 1 and 2 into the core metal to produce a continuous layer of $V_3Ga$ 10 as shown in FIG. 3 between the core 6 and the sheath 4, the sheath 4 shown in FIG. 3 containing a small amount of residual gallium and in a preferred embodiment aluminum when aluminum is incorporated into the copper alloy making up the sheath. It is not necessary to have an unreacted amount of vanadium as a core after the heat treatment.

According to the present invention, a superconductor of $V_3Ga$ containing 0-10 atomic percent aluminum is produced by making a composite comprising copper, containing 0.1 to 30 atomic percent gallium and 0 to 10 atomic percent aluminum and a core metal, i.e., vanadium alloy containing 0.1 to 25 atomic percent aluminum and fabricating the resulting composite to a desirable configuration, for example, the composite is fabricated into wires, tapes or pipes by wire drawing, rolling or pipe drawing, respectively. The composite thus fabricated to a desirable shape is then heat-treated to make gallium diffuse selectively from the alloy composed of copper, gallium and aluminum into the core metal to produce a continuous layer of $V_3Ga$ between the core metal and the copper containing a small amount of residual gallium at aluminum. It is not necessary to leave unreacted vanadium core after the heat treatment.

Copper is no diffused into $V_3Ga$ compound so the intrinsic superconducting properties of $V_3Ga$ are not degraded. On the basis of such fact, the method of this invention has been accomplished. As compared with the conventional methods as mentioned above the method of the present invention has the following advantages. As a result of the diffusion occuring between the core metal and the alloy composed of copper and gallium, a $V_3Ga$ layer and a metallic layer for stabilizing superconductivity consisting mainly of copper and formed. Furthermore, the copper gallium of copper-gallium-aluminum alloys used for producing $V_3Ga$ materials in the present invention can be readily melted in air and fabricating thereof at room temperature is exceedingly easy. Consequently, compared with the conventional production method, the method of the present invention simplified the process, and is valuable in the practical applications. Moreover, a multi-filimentary $V_3Ga$ superconductor suitable for AC application can be easily fabricated according to this invention.

As compared with the previous solid state diffusion method as mentioned above, the method of the present invention has the following advantages. The addition of aluminum to the vanadium core, and the optional addition of aluminum to the copper-gallium alloy matrix, facilitates the formation of a $V_3Ga$ layer at lower, i.e., 500° C.–600° C., temperatures than heretobefore. This results in shorter reaction times, improved superconducting current capacities, and the possibility of incorporating pure aluminum into the composite as a stabilizer prior to reaction.

According to the present invention, in the case of $V_3Ga$ a composite is made by using an alloy consisting of copper containing from 0.1 to 30, preferably 5 to 25, atomic percent of gallium and 0–10, preferably 0–5 atomic percent of aluminum and a core metal, that is vanadium containing from 0.1 to 25, preferably 1 to 10 atomic percent of aluminum to be subsequently fabricated into wires, tapes or pipes, etc., by means of wire drawing, rolling or pipe drawing, etc. Next, the product is heat-treated at temperatures of from 500° C. to 750° C. for the period of from 1 to 800 hours to make gallium selectively diffuse from said alloy into the core metal, i.e., vanadium alloy so as to form $V_3Ga$ layer on the core metal. Said heating temperature and period of time are determined depending upon the thickness and gallium and aluminum contents in the alloy composed of copper and gallium. In general when it is desirable to produce poducts having relatively thick sheaths surrounding the $V_3Ga$ layer longer periods of heat treatment at relatively higher temperatures e.g., 750° C. are utilized to ensure that the vanadium and gallium are capable of migrating to the interface layer formed between the sheath and core. The incorporation of aluminum into the copper alloy forming the sheath in the preferred embodiment of the process reduces both the length of time and the degree of temperature required to form the $V_3Ga$ layer.

Also, due to the heat-treatment, the metallic layer consisting mainly of copper which may serve as a layer for stabilizing superconductivity is formed on the surface of $V_3Ga$ superconductor. According to the present production method, it is possible to omit a high diffusion equipment involving large amount of construction cost requrired for continuously diffusing gallium into a vanadium substrate in the conventional $V_3Ga$ conductor production method. Therefore, the manufacturing cost is considerably reduced.

According to this invention, one or more of the composites are covered with or otherwise combined with a good conductive normal metal such as copper, silver or aluminum and fabricated into a desired configuration for the purpose of improving stabilization of superconductivity.

The good normal conductor coating may be produced by inserting the composite to a hole in the good normal conductor having a cross sectional shape corresponding to that of the composite, or by using a pipe-like composite and a pipe-like coating metal processed in such a manner that the outer diameter of the former is correspondent to the inner diameter of the latter and the former can be fitted into the latter. The cross sectional configuration of the superconductive matter can be prepared by an appropriate coating means in such a manner that the superconductive layer is located at a desirable position in the latter.

Alternately, the good normal conductor may be incorporated within its final structure by combining strands of wire of the normal conductor, copper, silver or aluminum, together with strands of the single or multifilamentary composite described above, in such proportion as required to ensure the desired degree of stability, together if necessary with further strands of wire of steel, tungsten or other such strong metal to confer the necessary mechanical strength, and twisting, braiding or cabling these various strands together into a final flexible round or flat configuration.

By the present invention, a conductor including many thin $V_3Ga$ superconductive filaments embedded in Cu-Ga alloy matrix can be easily fabricated. For example, a composite composed of Cu-Ga alloy and a number of vanadium alloy cores is fabricated into thin wire followed by heat treatment to produce a superconductor including many thin filaments of V$_3$Ga. Up to the present, both alloy or compound superconductors have not been used for AC application such as transformers, AC motors or generators due to their AC hysteresis losses. It is theoretically calculated than an AC loss in superconductors is proportional of d$^3$ where d is a diameter of a superconductor. Therefore, it can be expected that multi-filimentary V$_3$Ga superconductor produced by the present invention is not only suitable for DC application but also for AC application. In the case of AC application, on the contrary to DC application, it is desirable that the matrix around superconductive filaments has relatively high electrical resistivity for decoupling each superconductive filament electrically. In the case of the present invention, the resistivity of Cu-Ga or Cu-Ga-Al alloy matrix can be increased by increasing the Ga or Al content. The Cu-Ga or Cu-Ga-Al alloy matrix should be also effective for mechanical reinforcement of the superconductor.

Example. An ingot, approximately 100 grams in weight, of vanadium and ~ 5 wt. percent aluminum, based on the weight of the ingot, was melted in an arc furnace in an argon atmosphere. The ingot homogenized at 1400° C. for one hour, swaged to a rod 6.35 mm in diameter, and annealed for a further hour at 1200° C. The composition of the rod was subsequently found to be 10.1 atomic percent aluninum. An alloy of copper with 16.7 atomic percent gallium was melted in a vacuum induction furnace and chill cast into a bar 15 mm in diameter by 250 mm long. The bar was swaged to 12.7 mm diameter, and a hole 6.35 mm in diameter and 100 mm long was bored down the axis of the bar from one end. The bar was annealed for 5 hours at 700° C. A piece 100 mm long was cut from the vanadium alloy rod. Both rod and bar were carefully cleaned, and the vanadium alloy-rod inserted into the hole in the copper-alloy bar. The resulting composite was drawn through wire-drawing dies and reduced to a diameter of 0.635 mm, with intermediate anneals, ~1 hr. at 400° C., as necessary. In its sectional structure the vanadium alloy core is 0.318 mm diameter and the copper-alloy sheath is 0.159 mm thick.

Samples, 100 mm long, were cut from the wire, individually sealed under vacuum in quartz capsules, and were heat treated at temperatures between 525° C. for times up to 768 hours. A portion of each sample was examined metallographically to determine the thickness and nature of the reaction layer. Electron beam microanalysis was performed on selected samples to determine the composition of the reacted layers. The results are given in Table 1.

TABLE I

| Heat Treatment | | Microprobe Results Layer Thickness | Analysis (a/0) | | |
|---|---|---|---|---|---|
| | | | V | Ga | Al |
| 550° C. | 384 h | 2μm | 74 | 22 | 4 |
| 600° C. | 192 h | 2μm | 72 | 20.5 | 7.5 |
| 650° C. | 192 h | 4μm | 75.5 | 21.5 | 3 |
| 700° C. | 96 h | 8μm | 75 | 23 | 2 |

The presence of copper in the V$_3$Ga layer was not detected. The superconducting critical temperature of specimens reacted to 550, 600, 650 and 700° C. were measured inductively. The onset initial temperature is the highest temperature at which superconductivity was detected, the mid-point temperature corresponds to the temperature at which the magnitude of the inductive signal was exactly midway between its maximum and minimum values. Critical currents and upper critical fields at a temperature of 4.2 K were measured in externally applied transverse magnetic fields on samples heat-treated at 550° C. and 650° C. The upper critical fields and critical currents in applied fields of 6, 10, 16 and 20.2 tesla are given in Table II, together with those of layer thickness and critical temperature.

TABLE II

Summary of Experimental Results

| Heat Treatment | | Layer Thickness | Critical Temperature | | H$_{c2}$(4,2k) | Critical Current (4.2k). A. | | | |
|---|---|---|---|---|---|---|---|---|---|
| Temperature °C. | Time hrs | μm | Onset | Mid-point | T | 6 tesla | 10 tesla | 16 tesla | 20.2 tesla |
| 525 | 96 | 0.5 | | | | | | | |
| | 192 | 0.75 | | | | | | | |
| | 367 | 1.0 | | | | | | | |
| | 768 | 1.5 | | | | | | | |
| 550 | 96 | 1 | 15.2 | 14.15 | 21.5 | 26.2 | 14.2 | 4.9 | 0.65 |
| | 192 | 1.5 | 15.35 | 14.3 | 21.8 | 28.6 | 16.4 | 5.7 | 1.0 |
| | 384 | 2 | 15.35 | 14.5 | 22.0 | 33.6 | 18.4 | 6.5 | 3.2 |
| 600 | 24 | 0.75 | 15.0 | 14.2 | | 18.1 | 10.1 | 3.2 | |
| | 48 | 1 | 15.0 | 14.25 | 21.5 | 24.7 | 13.5 | 4.8 | 0.45 |
| | 96 | 1.5 | 15.15 | 14.3 | 21.7 | | | 5.2 | 0.9 |
| | 192 | 2 | 15.2 | 14.6 | | | | 6.2 | |
| | 384 | 2.5 | 15.25 | 14.5 | 22.0 | 36.1 | | 9.1 | 1.9 |
| 650 | 8 | 1 | 14.8 | 13.8 | 20.8 | | | | 0.25 |
| | 24 | 1.5 | 15.0 | 14.05 | 21.3 | | | | 0.8 |
| | 48 | 2 | 15.0 | 14.35 | 21.5 | | | | 1.3 |
| | 96 | 2.5 | 15.0 | 14.3 | | | | | |
| | 192 | 4 | 15.05 | 14.4 | | | | | |
| 700 | 4 | 1.5 | 14.6 | 13.4 | | | | | |
| | 8 | 2 | 14.7 | 13.9 | | | | | |
| | 24 | 3 | 14.75 | 14.1 | | | | | |
| | 48 | 5 | 14.75 | 14.25 | | | | | |
| | 96 | 8 | 14.7 | 14.1 | | | | | |
| 750 | 4 | 3.75 | | | | | | | |

It is clear from the said measurements of layer thickness, initial temperatures, critical field and critical current, and analytical results of the electron-probe microanalyser, that gallium in the copper-gallium alloy was selectively diffused into vanadium-aluminum alloy core by heat treatment at temperatures between 525° C. and 750° C., resulting in V$_3$Ga layer containing some aluminum. It is also clear that this layer is capable of carrying appreciable lossless currents up to fields close to its upper critical field.

What is claimed is:

1. A method of making a composite superconductor having $V_3Ga$ as the superconducting component comprising:
   providing an elongated core member consisting essentially of vanadium alloyed with 0.1 to 25.0 atomic percent aluminum;
   encasing said core with a sheath consisting essentially of copper alloyed with 0.1 to 30.0 atomic percent gallium; and
   heating the resulting composite to a temperature high enough and for a period of time sufficient to form a layer of $V_3Ga$ between said core and said sheath.

2. The method described in claim 1 wherein the copper alloy sheath contains from about 0.0 to about 10.0 atomic percent aluminum alloyed therein.

3. The method of producing a superconductor element as set forth in claim 1 wherein said step of providing an elongated composite is performed by providing a plurality of parallel rods of said core material within said outer copper allow sheath which thereby encompasses said rods.

4. The method of producing a superconductor element as set forth in claim 1 wherein the elongated composite member is subjected to plastic deformation to form it into a desired shape, and subjecting the thus formed composite to a heat treatment ranging from about 500° C. to about 750° C. to form a compound layer of $V_3Ga$ between said core and sheath.

5. A composite superconductor having an outer protective layer and a superconducting layer composed of $V_3Ga$ which comprises a composite body composed:
   an elongated solid core composed of a vanadium alloy, the vanadium in said core being alloyed with from 0.1 to 25.0 atomic percent aluminu;
   a copper alloy sheath encompassing said core member, said sheath containing from about 0.1 to about 30.0 atomic percent gallium;
   a $V_3Ga$ layer intermediate with said core and said sheath formed by heating said core and said while they are in intimate contact with each other.

6. A composite conductor made in accordance with the method of claim 1.

* * * * *